US012695325B2

(12) United States Patent
Wang et al.

(10) Patent No.: US 12,695,325 B2
(45) Date of Patent: ***Jul. 28, 2026

(54) METHOD AND SYSTEM FOR OPTIMAL CHARGING PROCESS OF LITHIUM-ION BATTERIES TO MITIGATE CELL DEGRADATION IN REAL TIME

(71) Applicant: Iontra Inc, Centennial, CO (US)

(72) Inventors: Zhong Wang, Sugar Land, TX (US); Daniel A. Konopka, Denver, CO (US); Ruzhou Yang, Hayward, CA (US); Lang Xia, Boyds, MD (US); Alan Ghazarians, San Diego, CA (US)

(73) Assignee: Iontra Inc, Centennial, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/200,193

(22) Filed: May 6, 2025

(65) Prior Publication Data

US 2025/0266703 A1 Aug. 21, 2025

Related U.S. Application Data

(63) Continuation of application No. 18/900,579, filed on Sep. 27, 2024.

(Continued)

(51) Int. Cl.
*H02J 7/90* (2026.01)
*G01R 31/367* (2019.01)
(Continued)

(52) U.S. Cl.
CPC ............ *H02J 7/933* (2026.01); *G01R 31/382* (2019.01); *G01R 31/392* (2019.01); *H01M 10/44* (2013.01);
(Continued)

(58) Field of Classification Search
CPC .... H02J 7/00712; H02J 7/005; G01R 31/382; G01R 31/392; H01M 10/44; H01M 10/48
(Continued)

(56) References Cited

U.S. PATENT DOCUMENTS 6,232,750 B1 * 5/2001 Podrazhansky ...... H02J 7/00711
                                                    320/139
6,377,030 B1 * 4/2002 Asao ..................... H02J 7/0069
                                                    320/161
(Continued)

FOREIGN PATENT DOCUMENTS

CN       107870305 A  *  4/2018   ........... G01R 31/392
CN       112327169 A  *  2/2021   ........... G01R 31/385
(Continued)

OTHER PUBLICATIONS

"Chaotic Behavior of Battery State of Health,", Bandong et al, 2019 6th International Conference on Electric Vehicular Technology (ICEVT), Nov. 18-21, 2019, Bali, Indonesia, IEEE, Published by IEEE Xplore Feb. 13, 2020, ieeexplore.ieee.org/document/8993986, 10.1109/ICEVT48285.2019.8993986 (Year: 2020).*

*Primary Examiner* — John T Trischler
(74) *Attorney, Agent, or Firm* — Polsinelli PC; Gregory P. Durbin

(57) ABSTRACT

A method and system for optimizing the charging process of lithium-ion batteries by utilizing a determined parameter as a cell degradation indicator are disclosed. The system and method enable intelligent charging, which may involve integrating a controller that adjusts the charging current in real-time based on the cell degradation indicator, calculated from probing the battery. This approach has various possible benefits to which the method and system may be tuned including extending battery lifespan, charge timing, and safety.

15 Claims, 17 Drawing Sheets

PROBE BATTERY TO GENERATE DATA TO COMPUTE A BATTERY PARAMETER (E.G., LYAPUNOV EXPONENT)

1500

WHEN THE BATTERY PARAMETER (E.G., LYAPUNOV EXPONENT) MEETS A THRESHOLD OR TARGET (E.G., 0 OR -0.1), CHANGE THE CHARGING CURRENT (E.G., REDUCE THE CHARGING CURRENT)

1510

Related U.S. Application Data

(60) Provisional application No. 63/540,921, filed on Sep. 27, 2023.

(51) Int. Cl.

| | |
|---|---|
| *G01R 31/374* | (2019.01) |
| *G01R 31/382* | (2019.01) |
| *G01R 31/392* | (2019.01) |
| *H01M 10/44* | (2006.01) |
| *H01M 10/48* | (2006.01) |
| *H02J 7/84* | (2026.01) |
| *G01R 31/36* | (2020.01) |
| *H01M 10/0525* | (2010.01) |
| *H02J 7/80* | (2026.01) |
| *H02J 7/92* | (2026.01) |
| *H02J 7/96* | (2026.01) |

(52) U.S. Cl.
CPC ............... *H01M 10/48* (2013.01); *H02J 7/84* (2026.01); *G01R 31/3648* (2013.01); *G01R 31/367* (2019.01); *G01R 31/374* (2019.01); *H01M 10/0525* (2013.01); *H01M 10/443* (2013.01); *H02J 7/80* (2026.01); *H02J 7/92* (2026.01); *H02J 7/96* (2026.01); *H02J 7/977* (2026.01)

(58) Field of Classification Search
USPC .................................................. 320/160, 162
See application file for complete search history.

(56) References Cited

U.S. PATENT DOCUMENTS

| | | | | |
|---|---|---|---|---|
| 6,567,752 B2* | 5/2003 | Cusumano | ........... | G01R 31/343 702/34 |
| 6,895,341 B2* | 5/2005 | Barrey | ................... | A61B 5/743 702/32 |
| 8,004,244 B2* | 8/2011 | Cromer | .............. | H02J 7/00304 320/135 |
| 8,013,577 B2* | 9/2011 | Nishino | .............. | H01M 10/441 320/152 |
| 8,163,410 B2* | 4/2012 | Fulop | ................... | H02J 7/0014 429/231.95 |
| 8,193,777 B2* | 6/2012 | Nakashima | ......... | H01M 50/409 320/147 |
| 8,288,995 B2* | 10/2012 | Jimbo | .............. | H02J 7/007182 320/147 |
| 8,305,045 B2* | 11/2012 | Maeagawa | ........ | H02J 7/007182 320/141 |
| 8,541,122 B2* | 9/2013 | Fulop | .................. | H01M 50/559 429/231.95 |
| 8,541,986 B2* | 9/2013 | Hiraoka | .............. | H02J 7/00712 320/162 |
| 8,578,494 B1* | 11/2013 | Engler | .................. | G06F 21/552 702/179 |
| 8,725,676 B1* | 5/2014 | Engler | .................. | G06F 21/552 707/703 |
| 8,725,677 B1* | 5/2014 | Engler | .................. | G06F 21/552 707/703 |
| 8,765,306 B2* | 7/2014 | Amiruddin | ........... | H02J 7/0069 429/231.95 |
| 8,816,648 B2* | 8/2014 | Bhardwaj | ............. | H02J 7/0071 320/152 |
| 8,912,762 B2* | 12/2014 | Suzuki | .................. | H01M 4/525 320/160 |
| 8,977,588 B1* | 3/2015 | Engler | .................. | G06F 21/552 702/196 |
| 8,988,045 B2* | 3/2015 | Klein | .................. | H01M 10/448 320/155 |
| 9,121,910 B2* | 9/2015 | Maluf | .................. | H01M 10/48 |
| 9,219,377 B2* | 12/2015 | Nagakura | ......... | H02J 7/007182 |
| 9,240,696 B2* | 1/2016 | Renken | ................. | H01M 10/44 |
| 9,246,344 B2* | 1/2016 | Suzuki | .................. | H01M 10/44 |
| 9,869,725 B2* | 1/2018 | Chaturvedi | .......... | G01R 31/388 |
| 10,181,740 B2* | 1/2019 | Tanaka | .................... | B60L 53/65 |
| 10,193,198 B2* | 1/2019 | Ishibashi | ........... | G01R 31/3828 |
| 10,230,250 B2* | 3/2019 | Shiraishi | ................... | H02J 7/04 |
| 10,250,052 B2* | 4/2019 | Patil | ...................... | H02J 7/0071 |
| 10,291,051 B2* | 5/2019 | Pourdarvish | ...... | H02J 7/007182 |
| 10,447,054 B2* | 10/2019 | Christensen | ........ | H01M 10/425 |
| 10,566,815 B2* | 2/2020 | Fujita | .................. | H01M 10/425 |
| 10,700,376 B2* | 6/2020 | Koch | ..................... | H01M 10/44 |
| 10,720,786 B2* | 7/2020 | Jung | .................... | H02J 7/0071 |
| 10,800,284 B2* | 10/2020 | He | ...................... | H01M 10/0525 |
| 10,879,718 B2* | 12/2020 | Hong | .................... | H01M 10/48 |
| 11,056,900 B2* | 7/2021 | Dang | ............... | H02J 7/007182 |
| 11,088,558 B2* | 8/2021 | Jung | ................. | H01M 10/0525 |
| 11,173,775 B2* | 11/2021 | He | ...................... | B60W 10/06 |
| 11,177,675 B2* | 11/2021 | Abe | ...................... | H02J 7/0048 |
| 11,201,489 B2* | 12/2021 | Subbotin | .............. | H01M 10/48 |
| 11,237,216 B1* | 2/2022 | Chang | .................. | H01M 10/052 |
| 11,283,103 B2* | 3/2022 | Hong | .............. | H01M 10/0525 |
| 11,448,702 B2* | 9/2022 | Horiuchi | ............... | H01M 4/364 |
| 11,735,940 B2* | 8/2023 | Pourdarvish | .......... | H01M 10/44 320/159 |
| 11,750,012 B2* | 9/2023 | Zhu | ...................... | G01R 31/392 320/137 |
| 11,764,415 B2* | 9/2023 | Hong | .................... | H01M 10/48 320/134 |
| 11,793,448 B2* | 10/2023 | Shimizu | .............. | A61B 5/0077 |
| 11,811,255 B2* | 11/2023 | Soga | ..................... | H01M 4/587 |
| 11,912,158 B2* | 2/2024 | Seo | ........................ | H02J 7/0048 |
| 11,940,500 B1* | 3/2024 | Chang | .................... | B60L 58/12 |
| 11,949,091 B2* | 4/2024 | Soga | ..................... | H01M 4/134 |
| 12,218,318 B2* | 2/2025 | Hong | .................. | G01R 31/388 |
| 12,224,616 B1* | 2/2025 | Yavas | .................... | G01R 29/24 |
| 12,313,687 B1* | 5/2025 | Chang | .................. | B60L 58/12 |
| 12,362,588 B1* | 7/2025 | Yavas | .................... | B60L 53/68 |
| 12,368,298 B2* | 7/2025 | Peron | .................. | B60L 58/18 |
| 12,370,922 B2* | 7/2025 | Seo | ...................... | G01R 31/388 |
| 12,397,678 B1* | 8/2025 | Chang | ................. | G01R 31/382 |
| 2002/0046004 A1* | 4/2002 | Cusumano | ........... | G01R 31/343 702/183 |
| 2003/0139692 A1* | 7/2003 | Barrey | ................... | A61B 5/743 600/595 |
| 2008/0042618 A1* | 2/2008 | Cromer | ................. | H02J 7/0031 429/82 |
| 2008/0129252 A1* | 6/2008 | Nishino | .............. | H01M 10/441 320/162 |
| 2009/0104510 A1* | 4/2009 | Fulop | .................. | H01M 50/553 429/50 |
| 2010/0033138 A1* | 2/2010 | Alger | .................. | H02J 7/0071 320/153 |
| 2010/0072951 A1* | 3/2010 | Nakashima | .......... | H02J 7/00711 320/145 |
| 2010/0327810 A1* | 12/2010 | Jimbo | .................. | H02J 7/0071 320/126 |
| 2011/0037438 A1* | 2/2011 | Bhardwaj | ............. | H02J 7/0071 320/152 |
| 2011/0236751 A1* | 9/2011 | Amiruddin | ......... | H01M 4/0447 429/188 |
| 2011/0267001 A1* | 11/2011 | Hiraoka | ............ | H01M 10/0525 320/162 |
| 2011/0316548 A1* | 12/2011 | Ghantous | ........... | H01M 50/569 324/427 |
| 2012/0086406 A1* | 4/2012 | Maeagawa | ........ | H02J 7/007182 320/162 |
| 2012/0133338 A1* | 5/2012 | Suzuki | .................. | H01M 10/44 320/160 |
| 2012/0212184 A1* | 8/2012 | Klein | ............... | H02J 7/007194 320/134 |
| 2012/0263986 A1* | 10/2012 | Fulop | .................... | H02J 7/0068 429/94 |
| 2013/0069584 A1* | 3/2013 | Nagakura | ........ | H02J 7/007182 320/162 |
| 2013/0207618 A1* | 8/2013 | Renken | ............ | H02J 7/007182 320/155 |
| 2013/0311115 A1* | 11/2013 | Chaturvedi | .......... | G01R 31/367 702/63 |

(56)     References Cited

U.S. PATENT DOCUMENTS

| | | | | |
|---|---|---|---|---|
| 2013/0311116 A1* | 11/2013 | Chaturvedi | ............. | G06F 17/11 |
| | | | | 702/63 |
| 2013/0311117 A1* | 11/2013 | Chaturvedi | ............. | G06F 17/11 |
| | | | | 702/63 |
| 2013/0335034 A1* | 12/2013 | Suzuki | ............. | H01M 10/0525 |
| | | | | 320/160 |
| 2014/0021959 A1* | 1/2014 | Maluf | ................... | H02J 7/0048 |
| | | | | 324/426 |
| 2014/0023888 A1* | 1/2014 | Fulop | ................... | H02J 7/0068 |
| | | | | 429/50 |
| 2015/0236529 A1* | 8/2015 | Tanaka | ................... | B60L 53/65 |
| | | | | 320/109 |
| 2015/0357859 A1* | 12/2015 | Pourdarvish | ........ | H02J 7/00712 |
| | | | | 320/159 |
| 2016/0301225 A1* | 10/2016 | Shiraishi | ........... | H02J 7/007194 |
| 2017/0163046 A1* | 6/2017 | Patil | ......................... | H02J 7/04 |
| 2017/0203654 A1* | 7/2017 | He | ............................ | B60L 7/10 |
| 2017/0203667 A1* | 7/2017 | He | ........................... | B60L 58/21 |
| 2017/0279171 A1* | 9/2017 | Ishibashi | ............. | H01M 10/486 |
| 2017/0288414 A1* | 10/2017 | Klein | ...................... | B60L 58/16 |
| 2017/0338666 A1* | 11/2017 | Christensen | ......... | G01R 31/392 |
| 2018/0076633 A1* | 3/2018 | Fujita | ................. | H02J 7/00047 |
| 2018/0226693 A1* | 8/2018 | Hong | ................. | H02J 7/00714 |
| 2019/0031035 A1* | 1/2019 | Koch | ............... | H01M 10/0525 |
| 2019/0123574 A1* | 4/2019 | Jung | .................... | H01M 10/44 |
| 2019/0222051 A1* | 7/2019 | Pourdarvish | ...... | H02J 7/007184 |
| 2019/0237974 A1* | 8/2019 | Dang | ................. | H02J 7/00714 |
| 2019/0269361 A1* | 9/2019 | Shimizu | ............... | A61B 5/7475 |
| 2019/0363546 A1* | 11/2019 | Abe | ...................... | H02J 7/0047 |
| 2020/0136173 A1* | 4/2020 | Hong | ................ | H01M 10/0525 |
| 2020/0335993 A1* | 10/2020 | Jung | ..................... | H01M 10/44 |
| 2020/0403220 A1* | 12/2020 | Soga | ................. | H02J 7/00712 |
| 2020/0403432 A1* | 12/2020 | Soga | ................. | H01M 10/0525 |
| 2021/0057919 A1* | 2/2021 | Subbotin | ............. | H01M 10/486 |
| 2021/0099003 A1* | 4/2021 | Zhu | ..................... | H01M 10/443 |
| 2021/0135479 A1* | 5/2021 | Hong | ................. | H01M 10/44 |
| 2021/0364575 A1* | 11/2021 | Horiuchi | .............. | H01M 4/364 |
| 2021/0370796 A1* | 12/2021 | Seo | ........................ | H02J 7/0048 |
| 2022/0131370 A1* | 4/2022 | Peron | ..................... | B60L 58/18 |
| 2022/0263117 A1* | 8/2022 | Hanchett | ............ | H02J 7/00712 |
| 2023/0207916 A1* | 6/2023 | Konopka | ............. | H01M 10/44 |
| | | | | 429/62 |
| 2023/0336017 A1* | 10/2023 | Konopka | ............. | H02J 7/0048 |
| 2023/0369663 A1* | 11/2023 | Hong | ................. | H01M 10/44 |
| 2023/0393217 A1* | 12/2023 | Gill | ..................... | H01M 10/425 |
| 2024/0243600 A1* | 7/2024 | Konopka | ............ | H02J 7/005 |
| 2024/0243601 A1* | 7/2024 | Konopka | ........... | G01R 19/0053 |
| 2024/0250549 A1* | 7/2024 | Fasching | .............. | H01M 10/48 |
| 2024/0300378 A1* | 9/2024 | Seo | ........................ | H01M 10/48 |
| 2024/0339843 A1* | 10/2024 | Konopka | ............. | H01M 10/48 |
| 2025/0038559 A1* | 1/2025 | Fasching | ............ | H01M 10/425 |
| 2025/0096336 A1* | 3/2025 | Konopka | ............. | G01R 31/392 |
| 2025/0105649 A1* | 3/2025 | Wang | ................. | H01M 10/44 |
| 2025/0266517 A1* | 8/2025 | Konopka | ............. | H01M 10/446 |

FOREIGN PATENT DOCUMENTS

| | | | | | |
|---|---|---|---|---|---|
| CN | 112784432 A | * | 5/2021 | ............. | G06F 30/20 |
| CN | 115241935 A | * | 10/2022 | ................. | H02J 3/48 |
| CN | 116679210 A | * | 9/2023 | ........... | G01R 31/367 |

* cited by examiner

TIME (s)

OVERPOTENTIAL (V)

CCCV-1.5C
PF PROFILE

1000

1002

PROBE BATTERY TO GENERATE DATA TO COMPUTE A
BATTERY PARAMETER (E.G., LYAPUNOV EXPONENT)

1500

WHEN THE BATTERY PARAMETER (E.G., LYAPUNOV
EXPONENT) MEETS A THRESHOLD OR TARGET (E.G., 0 OR
-0.1), CHANGE THE CHARGING CURRENT (E.G., REDUCE
THE CHARGING CURRENT)

1510

METHOD AND SYSTEM FOR OPTIMAL CHARGING PROCESS OF LITHIUM-ION BATTERIES TO MITIGATE CELL DEGRADATION IN REAL TIME

CROSS-REFERENCE TO RELATED APPLICATIONS

The present application is a Continuation of U.S. patent application Ser. No. 18/900,579, filed Sep. 27, 2024, titled "METHOD AND SYSTEM FOR OPTIMAL CHARGING PROCESS OF LITHIUM-ION BATTERIES TO MITIGATE CELL DEGRADATION IN REAL TIME" which is related to and claiming priority under 35 U.S.C. § 119 to U.S. Provisional Application No. 63/540,921 filed Sep. 27, 2023, titled "Method and System for Optimal Charging Process of Lithium-Ion Batteries to Mitigate Cell Degradation in Real Time," which is hereby incorporated by reference herein.

The present application is related to U.S. Non-Provisional application Ser. No. 18/900,551, filed Sep. 27, 2024, titled "Electrodynamic Parameters," which is hereby incorporated by reference herein.

TECHNICAL FIELD

Aspects of the present disclosure involve an inventive method to obtain data from the battery and calculate a parameter (e.g., the Lyapunov exponent), or information indicative of and/or correlated to the parameter, from a response of the battery cell stimulated by a probing signal to provide insights into cell health and degradation in real time, and control charging or discharging of the battery based on the same.

BACKGROUND AND INTRODUCTION

Battery powered devices have proliferated and become ubiquitous. device manufactures are constantly pressing for performance improvement in batteries, particularly as batteries are introduced into devices with relatively higher current demands and power needs. At the same time, consumers demand longer battery life, longer times between charges, and shorter charge times. As such, there is an ongoing and continuous need for improvements in how batteries are managed, charged and discharged to enhance performance. It is with these observations in mind, among many others, that the various aspects of the present disclosure were conceived.

SUMMARY

Aspects of the present disclosure involve a method of charging a battery comprising obtaining a Lyapunov exponent value based on at least one measurement from a battery; and based on the Lyapunov exponent value relative to a threshold, altering a charge parameter to the battery.

In various aspects, the at least one measurement is at least one of a voltage measurement or a current measurement. The voltage measurement or current measurements may be taken in the presence of a probe signal comprising a transition from an active period including a current to the battery to a rest period. In some aspects, the measurement is taken during the active period or the measurement is taken during the rest period, where the rest period is a period where no current is applied to the battery and the voltage measurement is transitioning to an open circuit voltage of the battery. The measurement may also be taken during a transition from the active period to the rest period. In some situations, the current is a charge current and the rest period comprises a time period when there is no charging current following the charging current.

The threshold may be representative of a transition to chaotic behavior of the battery, representative of an anode overpotential of 0. In generally, the threshold is set to alter the charge parameter to maintain the anode overpotential greater than 0. Or, not fall below 0 (become negative). In some instances, the charge control may result in a negative anode overpotential that is quickly resolved, and returned to a positive value.

The charge parameter being altered may be charge current, which may involve a charge current reduction, but also may involve a charge current increase or alteration of some other attribute of the charge signal. The other attribute may effect the average charge current, for example, by modifying pulse width or duty cycle of a pulse charge.

As will be understood for the description, the Lyapunov exponent correlates to anode overpotential allowing anode overpotential to be assessed without direct measurement of the anode overpotential.

Another aspect of the present disclosure involves a battery charging method comprising applying a probing waveform to a battery; measuring at least one of current or voltage at the battery in the presence of the probing waveform; computing a value associated with a Lyapunov exponent from the measurement; comparing, at a PID controller, the Lyapunov exponent with a degradation threshold, and generating a charging current adjustment value based on the comparison of the Lyapunov exponent with the degradation threshold.

The degradation threshold may be a chaotic threshold or an anode overpotential threshold. In some examples, the charging current adjustment value is a multi-step charge current decrease, with each step of the charge current decrease occurring as the value associated with the Lyapunov exponent approaches or reaches the degradation threshold. The value associated with the Lyapunov exponent correlates to anode overpotential allowing anode overpotential to be assessed without direct measurement of the anode overpotential, and wherein the degradation threshold is set based on an anode overpotential of 0. The PID controller seeks to adjust the charging current adjustment value to maintain a positive anode overpotential.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. It should be noted that the drawings are not necessarily to scale; however, the emphasis instead is being placed on illustrating the principles of the inventive concepts. Also, in the drawings the like reference characters may refer to the same parts or similar throughout the different views. It is intended that the embodiments and figures disclosed herein are to be considered illustrative rather than limiting.

DETAILED DESCRIPTION

Lithium Plating and Anode Overpotential

Lithium plating is a primary cause of battery degradation in Lithium-Ion type batteries. Lithium plating, also known as lithium metal plating, occurs when lithium ions are deposited onto the anode surface during charging in a non-uniform and uncontrolled manner. Lithium plating reduces the number of lithium ions available for normal battery operation reducing battery capacity over time. Lithium plating also leads to the formation of metallic lithium, which can accumulate on the anode surface and create dendritic structures. In some cases, the dendrites can pierce through the separator between electrodes (e.g., the separator between the anode and cathode), causing internal short circuits, and battery failure, which in some cases may also lead to thermal runaway.

Anode overpotential is a measure of the difference between the actual potential of the anode and its equilibrium potential. In an ideal scenario, during charging, lithium ions should deposit and intercalate into the anode at a consistent voltage, corresponding to the anode's equilibrium potential. In practice, due to various factors, including resistance in the electrolyte and at the anode-electrolyte interface, the actual voltage required to drive lithium deposition is often higher than the equilibrium potential. This voltage difference is the anode overpotential.

The occurrence of lithium plating is closely linked to the anode overpotential. When the anode overpotential drops to zero or becomes negative, there is not enough voltage to drive the lithium ions into the anode material as intended. This condition can lead to lithium plating. However, outside of a controlled lab environment, measuring anode overpotential in real-time to indicate cell degradation in a commercial lithium-ion battery may not be practical at least due to expenses, the possible need for additional connections (in addition to the conventional two connections to the anode and cathode for charge and discharge) to and into the cell structure of the battery among other requirements and hurdles.

Aspects of the present disclosure involve a novel method to obtain data from the battery and calculate a parameter, or information indicative of the parameter, from a response of the battery cell stimulated by a probing signal to provide insights into cell health and degradation in real time. In one example, the parameter is strongly correlated to anode overpotential, and based upon the parameter value, charging or discharging of the battery may be controlled to alter anode overpotential and hence put the battery into a charging or discharging state in which the various degradations associated with anode overpotential are reduced or eliminated.

Cell Probing and Lyapunov Exponent (LE) Calculation

Figure 1A:
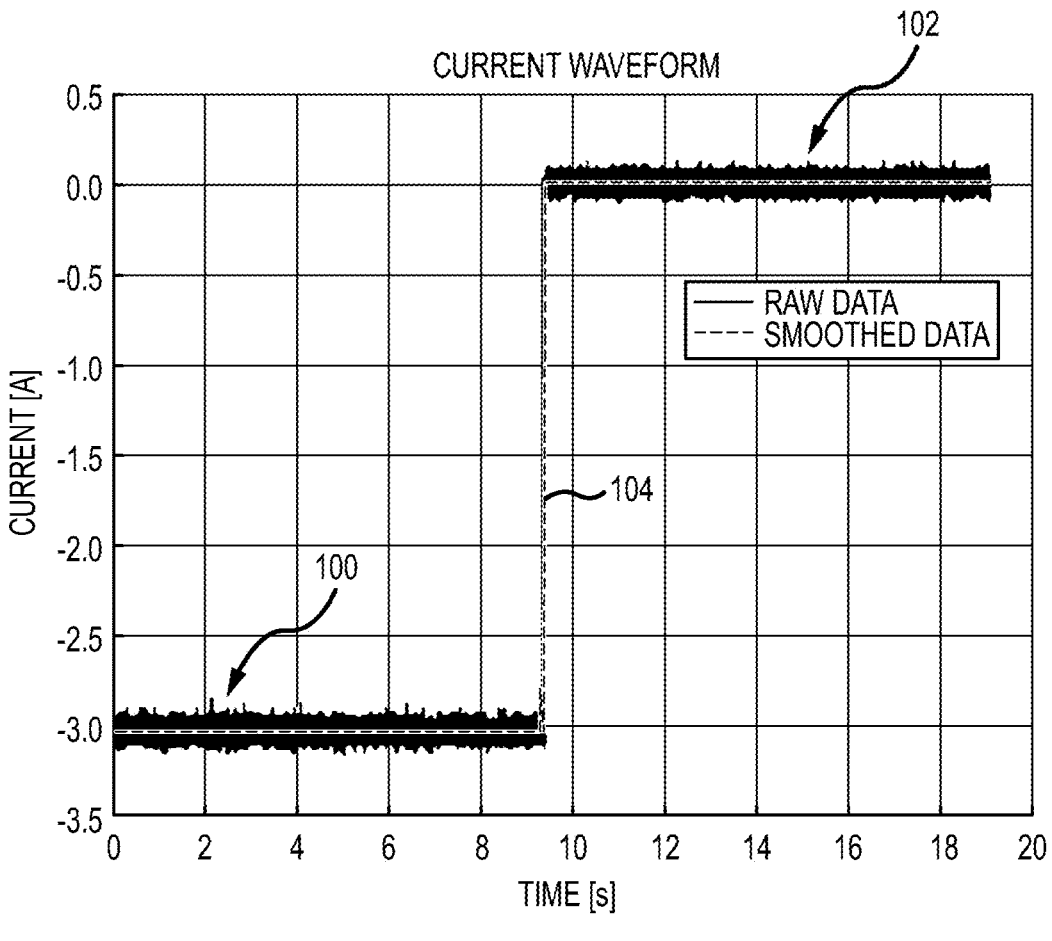
FIG. 1A shows a current measurement of a probing waveform.

Aspects of the present disclosure involve a method for optimally charging a battery to reduce or avoid battery degradation. To begin, the battery is probed to generate data from which a parameter (e.g., the Lyapunov exponent (LE)) may be computed. In one example, the battery is probed with a unipolar pulse waveform, an example of which is shown in FIG. 1A. The probing waveform may be a momentary pulse of a charge signal or portion of a charge signal, may be a distinct probe signal (e.g., during a short period when charging is halted), or may be initiated in conjunction with charging or discharging, or otherwise. In the example of FIG. 1A, the probing waveform involves a charging portion 100 and a rest period 102 with a transition 104 (or edge) between the same. In the example, the duration (period) of the whole current probing waveform is 20 sec. including 10 sec. of charging part and 10 sec. of resting part. It should be noted that the "charging part" may be any length of time while charging is active, and the rest being a momentary rest (e.g., 10 secs) before charge resumes. In the example illustrated, the magnitude of the charging current is 3A. It should be recognized that the probing waveform may vary in duration, shape, the charging portion and/or rest period may vary, and the current levels may vary depending on various factors including the type of battery.

Using data, e.g., voltage and/or current measurements from the battery, based on the probing signal, the parameter is computed. In one example, the measurements may be conducted during the charging period of the probing signal.

Figure 1B:
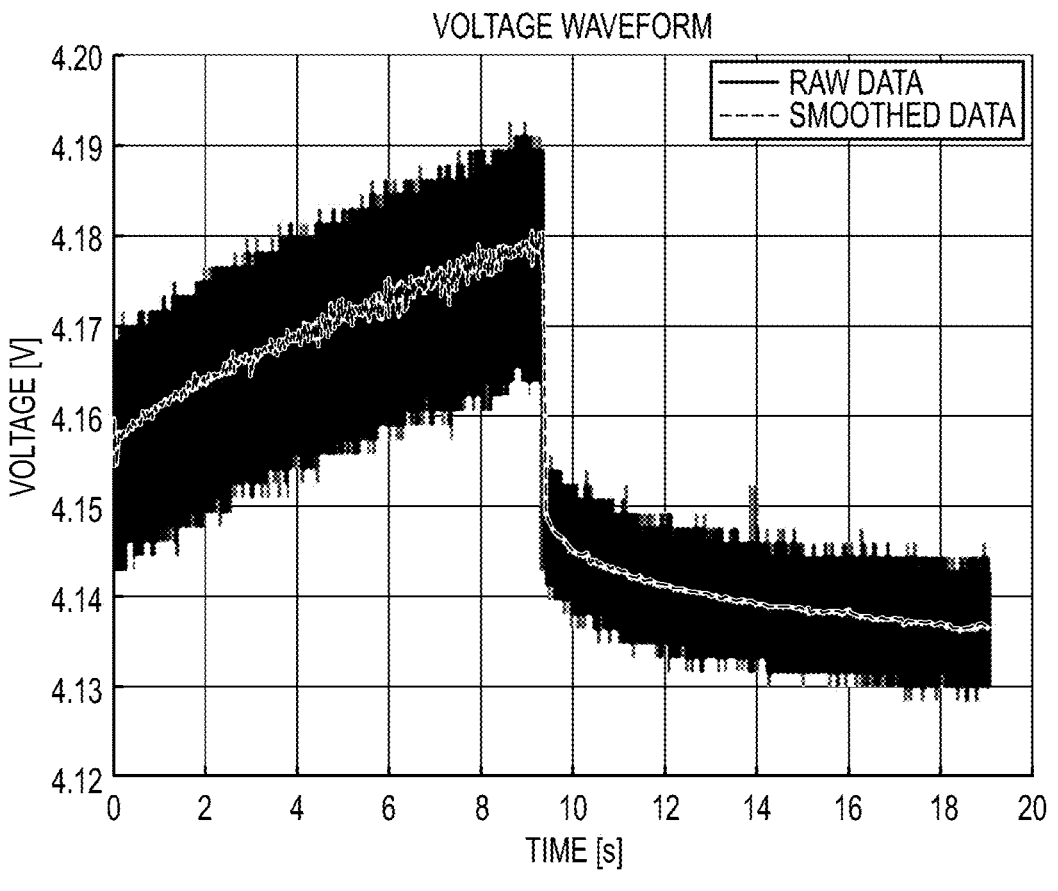
FIG. 1B shows a voltage measurement of the probing waveform of FIG. 1A.

In another example, the measurements may be conducted very shortly after the probing signal transitions to the rest period. At this time, the current drops immediately to zero (as shown in FIG. 1A) and the voltage transitions, as shown in FIG. 1B, over a few seconds to the battery voltage. During charge, the voltage measured at the battery is higher than when no charge is applied. However, the voltage does not drop immediately to the open circuit voltage of the battery. In the transition 104 from an active signal, which may be the charge current 100, to rest 102, the anode overpotential drops and other battery states are less active and hence the information related to anode overpotential may be more prevalent in this transition period. In one specific example, the system computes the Lyapunov exponent (LE) or obtains a value or values indicative of the Lyapunov exponent. While it is possible to compute the Lyapunov exponent directly, it is also possible to use a proxy for the same. In one specific example, the voltage waveform, which may be in time voltage value pairs of a time series data, is captured during the relaxation period after the current is turned off and the time series is used to compute the Lyapunov exponent. The utilization of Lyapunov exponent calculation is correlated with cell degradation, and hence can be used as discussed herein to manage charging of a battery to avoid or minimize degradation.

The Lyapunov exponent is a mathematical concept used to measure the sensitivity of a dynamical system to small perturbations. It is a measure of the average rate of divergence or convergence of nearby trajectories in phase space, where phase space is the space of all possible states of the system.

More precisely, the Lyapunov exponent is defined as the limit of the logarithm of the ratio of the separation between two nearby trajectories to their initial separation, as the separation goes to zero. Mathematically, it can be expressed as follows:

$$\lambda = \lim_{t \to \infty} (1/t) * \log(\|\delta x(t)\| / \|\delta x(0)\|)$$

where $\lambda$ is the Lyapunov exponent, t is the time, $\delta x(t)$ is the separation vector between two nearby trajectories at time t, and $\delta x(0)$ is the initial separation vector between the two trajectories.

In simpler terms, the Lyapunov exponent measures the average rate at which nearby trajectories in phase space diverge or converge over time. If A is positive, the trajectories diverge exponentially and the system is said to be chaotic, indicating that small differences in initial conditions can lead to vastly different outcomes over time. If A is negative, the trajectories converge exponentially and the system is stable, indicating that small differences in initial conditions will converge over time.

The Lyapunov exponent is a fundamental concept in chaos theory and provides insight into the long-term behavior of complex systems and can help predict the stability or instability of a system over time.

Aspects of the present disclosure involve the unique recognition that the Lyapunov exponent is strongly correlated to anode overpotential. And, hence, the Lyapunov component may be used as indicator of lithium plating, and charge (or discharge) control altered based on the same. Thus, computation of LE provides information correlated to anode overpotential without modification of a battery, which would be necessary otherwise to directly measure anode overpotential, among other advantages.

Figure 2A:
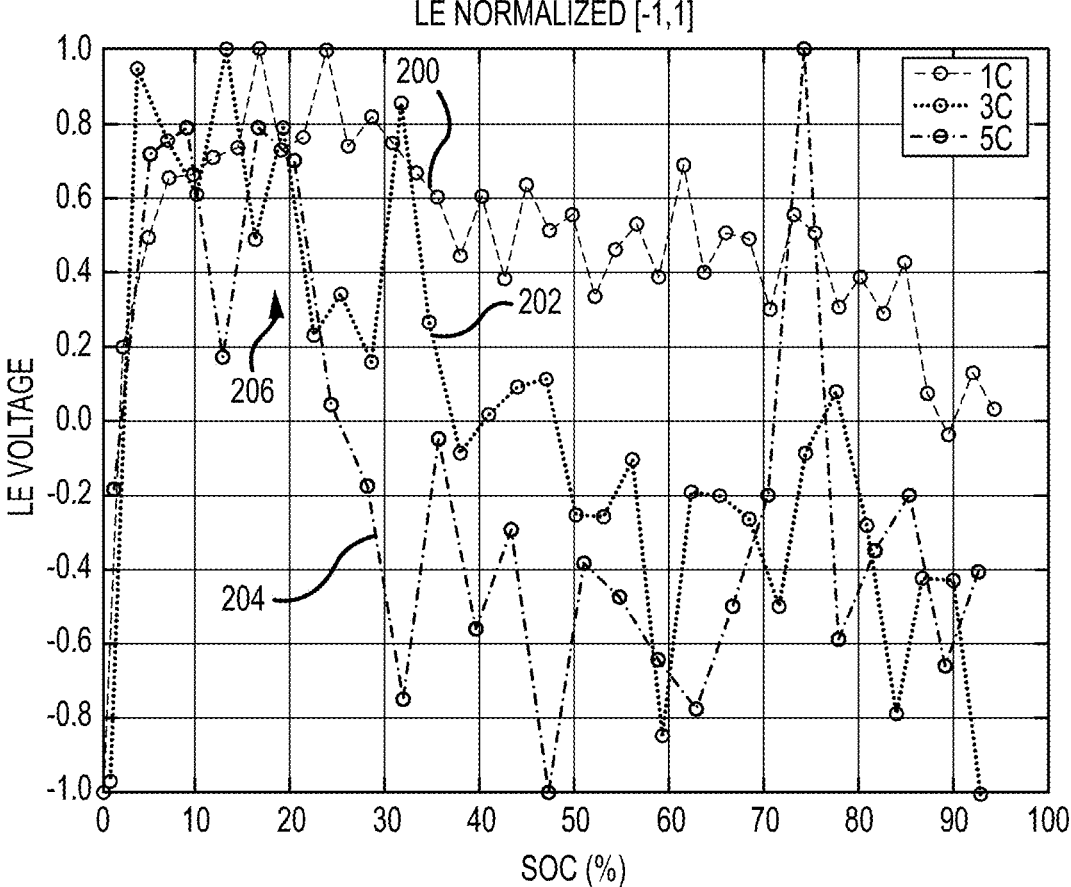
FIG. 2A shows Lyapunov exponent (LE) computations (normalized between −1 and 1) taken from measurements, e.g., a back edge voltage measurement (transition from active charge current to rest) like shown in FIG. 1B, at a battery for 1C, 3C and 5C charging rates between 0 and 100% SOC.

FIG. 2A shows the Lyapunov exponent calculation based on measurements taken during the transition period between rest and charging of the probing waveform. In the example probing waveform, voltage and current measurements are made around 10 seconds where the probing waveform transitions 104. Stated differently, the LE is calculated from measurement take on the back edge of the probing waveform. In the example of FIG. 2A, the LE computations are done at different states of charge during the charge process. The LE values are for a new, less than 10 previous charge and discharge cycles, of a 30T type Lithium Ion battery cell with different charge rates of 1C (200), 3C (202) and 5C (204). The LE values are normalized to [−1, 1] for comparison purpose. It can be seen that the LE curves with different charge rates begin diverging 206 at around 20% SOC.

Figure 2B:
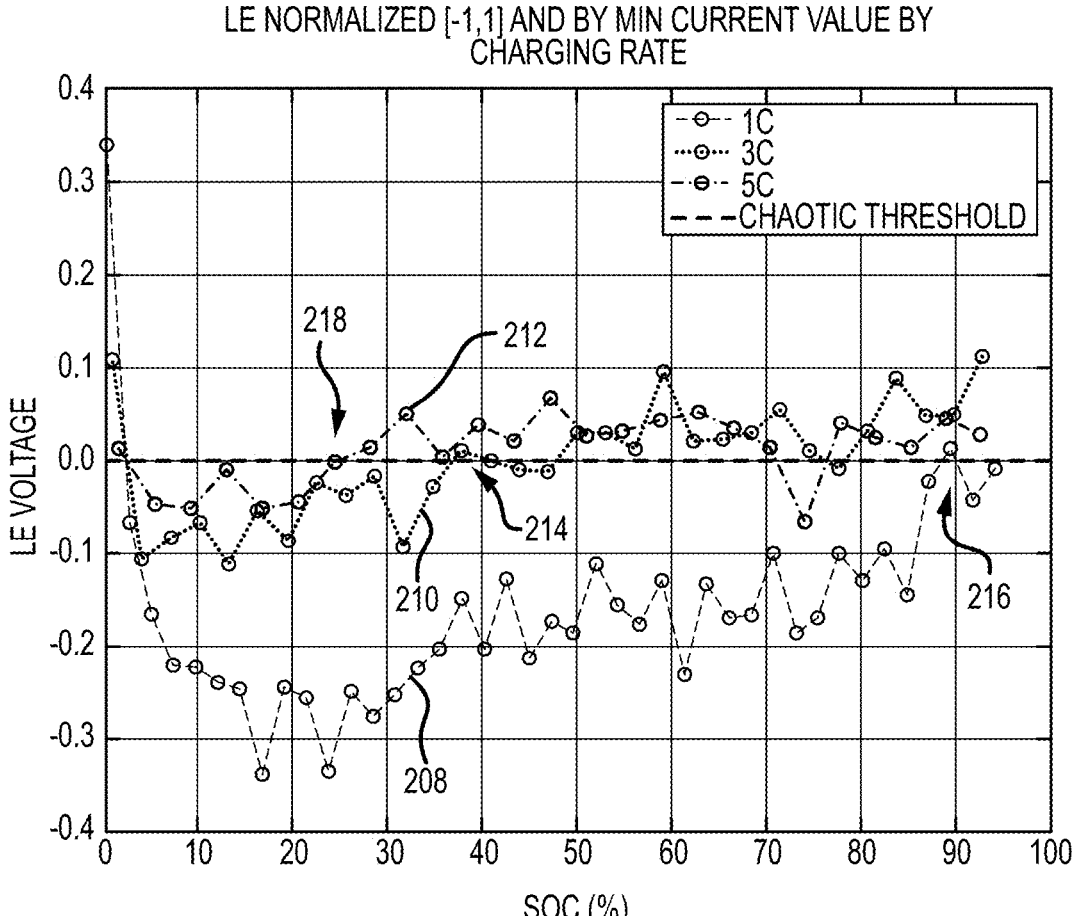
FIG. 2B shows Lyapunov exponent (LE) computations (normalized between −1 and 1, and divided by a minimum current value of the respective charging rates) taken from measurements, e.g., a back edge measurement (transition from active to rest) like shown in FIG. 1B, at a battery for 1C, 3C, and 5C charging rates, with a chaotic threshold (dashed line) at 0).

FIG. 2B presents the information in different form. Here, the LE computations are normalized to [−1,1] then divided by the minimum current value of each charging rate (1C (208), 3C (210) and 5C (212)), respectively.

The plots in FIG. 2A show us that at higher charge rates, the LE value decreases more rapidly. This indicates more severe cell degradation at higher charge rates. In FIG. 2(B), the LE values exceed a chaotic threshold 212 at about 24% SOC when charging at 5C, exceed the chaotic threshold 214 at about 38% when charging at 3C, and does not exceed the chaotic threshold 218 until about 90% when charging at 1C. As such, the information reveals that altering charge rate based on approaching the chaotic threshold for LE, may be used to prevent or reduce battery degradation. So, for example, if charging at 5C, the system might reduce the charge rate at or before reaching the chaotic threshold (e.g., at 24% SOC).

Figure 3:
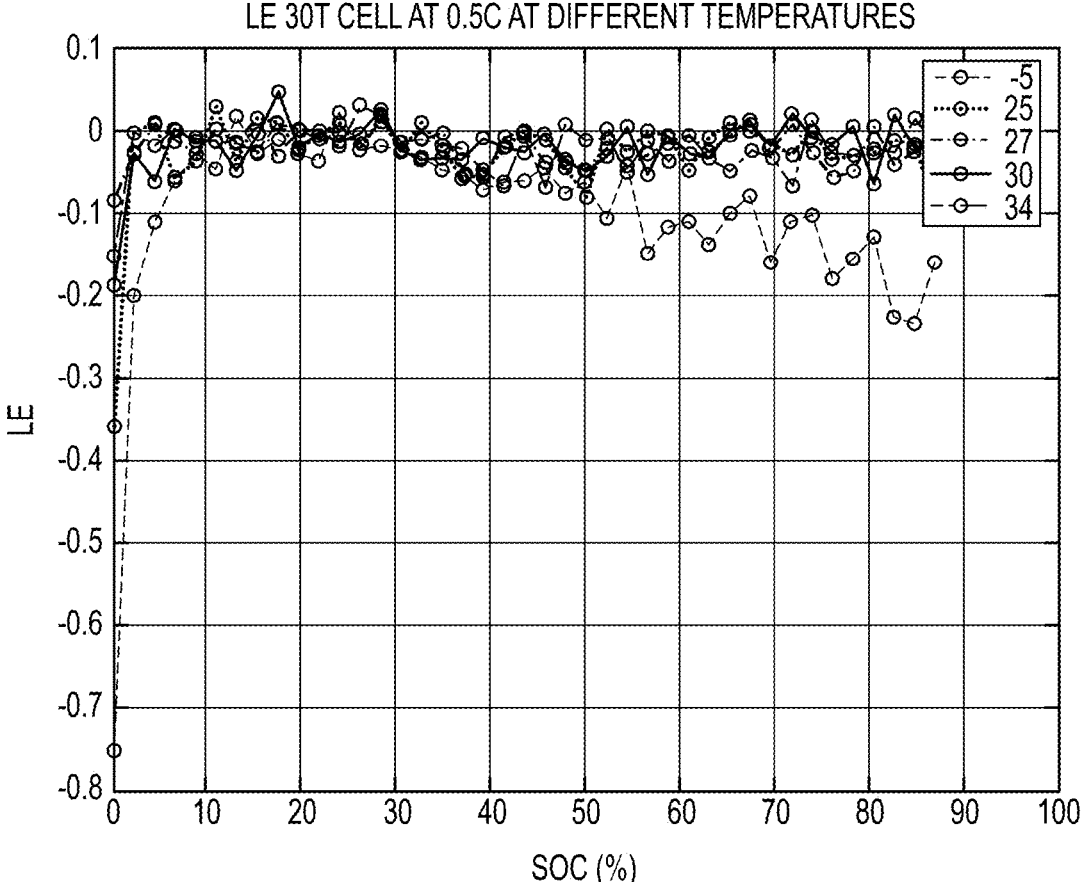
FIG. 3 shows LE calculations of back edge of voltage waveform, which may be a probing waveform, at different temperatures (−5, 25, 27, 30, and 34 degrees Celsius).

In FIG. 3, a 30T cell was charged with a 0.5C charge rate at different temperatures. It can be seen that at higher temperatures (25 deg., 27 deg., 30 deg., 34 deg.), the LE values are close to zero which indicates non-significant cell degradation. At a lower temperature (−5 deg.), the LE value decreases at SOC around 30%, indicating a significant cell degradation due to low temperature.

As such, the information also informs us that cell temperature may also be used, in coordination with computation of the LE component, to inform charging rates and control the same. For example, charge might be halted for a period until the battery temperature increases, or slow charge initially when at low temperatures, among other possibilities.

Correlation Between Anode Overpotential and Ly. Exp Calculation

Figure 4:
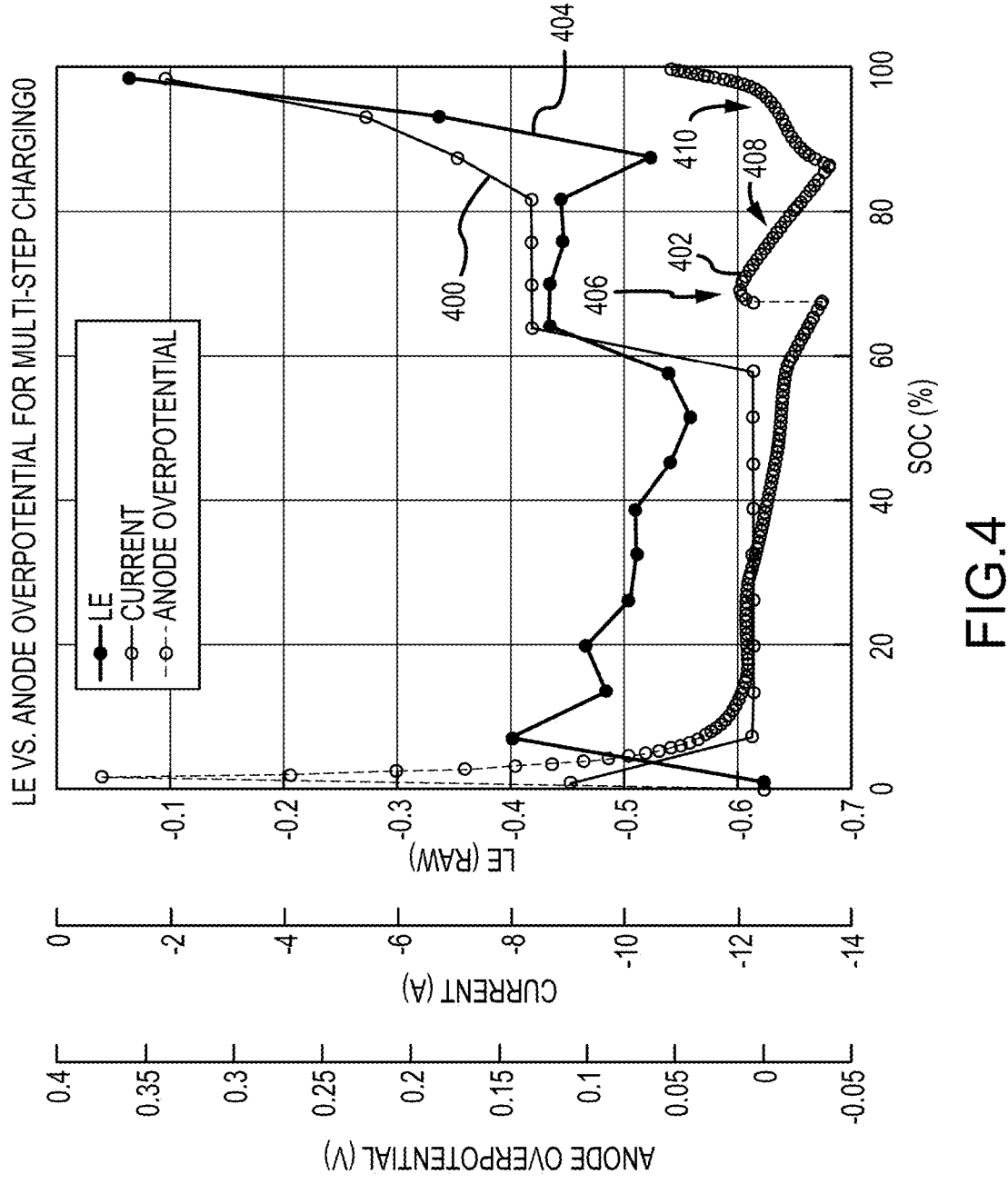
FIG. 4 is a diagram showing correlation between LE calculations and anode overpotential for a multi-step charging process.

In further support of using LE as trigger for charge control (e.g., LE calculation from data gathered during the probing waveform) based on the LE being a lithium plating indicator is the strong correlation between LE and anode overpotential, shown in FIG. 4. As discussed, a negative anode potential triggers lithium plating in lithium-ion batteries. FIG. 4 shows the charging current (400), anode overpotential (402) and Lyapunov exponent (404) of a multi-step CCCV charging process on a 30T cell. The current curves shows the cell was charged with a 12.2A constant current from about 5% SOC until about 60% SOC, then charged with an 8.4 A constant current to about 81% SOC, at which time the charging scheme changed to a constant voltage charge where the terminal voltage of the battery was held constant by steadily reducing the charge current. During charging, LE was computed in 5% SOC intervals. In one example, charging may be discontinued for a very short period, and a probing signal injected into the battery. In another example, the charge current may be altered, e.g., turned off for some time, e.g., 10 seconds, and battery measurements taken at the transition from charge current to 0 or some relatively lower charge current. The curve 402 is a simulated anode overpotential based on the charging current profile using a PyBaMM model of the 30T cell. It can be seen that the anode overpotential kept decreasing during the first stage of charging (12.2A charging). Anode overpotential dropped to zero at around 20% SOC indicating the onset of significant lithium plating. After 60% SOC, when the charging current was reduced to 8.4A, the anode overpotential immediately increased 406 to slightly above zero, and then almost immediately began decreasing. Since the charge current at this time was still relatively high, e.g., compared to a 1 C charge rate, the anode overpotential quickly decreased 408 into negative condition where plating continued. Nonetheless, the current change to a lesser current, appears to have slowed or stopped lithium plating due to the increase in anode overpotential, if even briefly. The overpotential again began to increase 410 after the charge process entered into constant voltage stage, where the charge current was steadily decreasing, and transitioned back into a positive value toward the end of charge at a charge current of around 6A and less (about 97% SOC) at end of charge. Here, it can be observed that the LE curve strongly correlates with anode overpotential during the whole charging process making it possible to use LE as an indicator, which may be considered real-time, of lithium plating.

Optimal Charging Controller Based on Real-Time Cell Degradation Feedback

Figure 5:
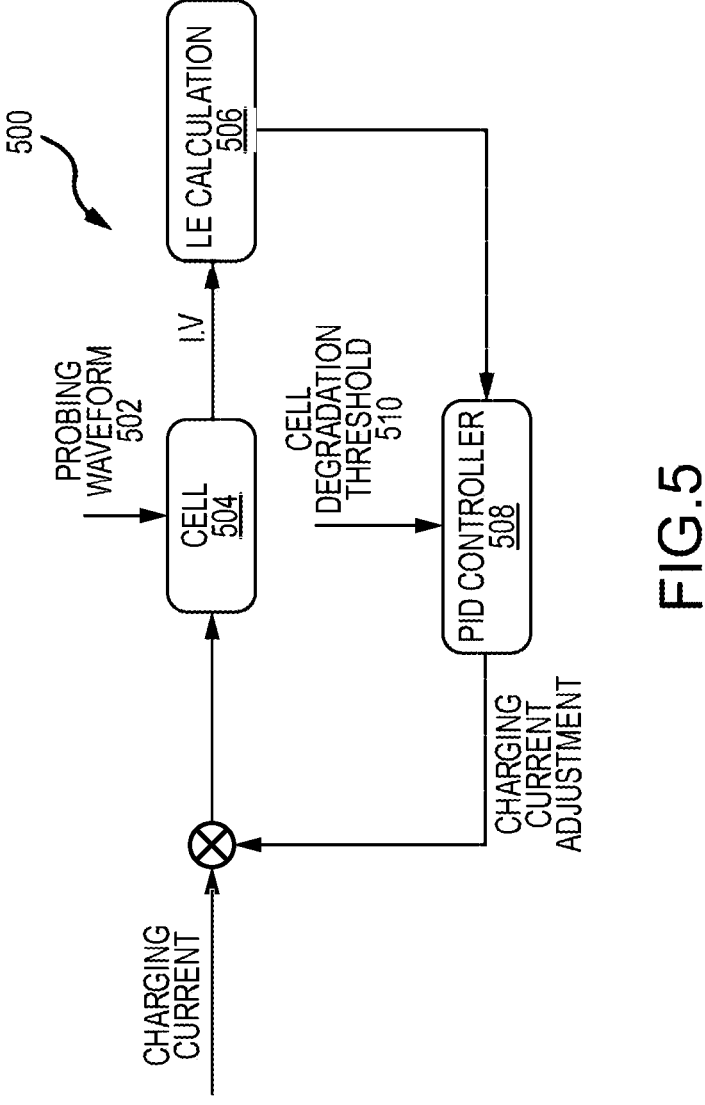
FIG. 5 is a system diagram for an LE based feedback controller for optimal charging, to adjust charging based on computations of LE and its correlation to anode overpotential.
Figure 15:
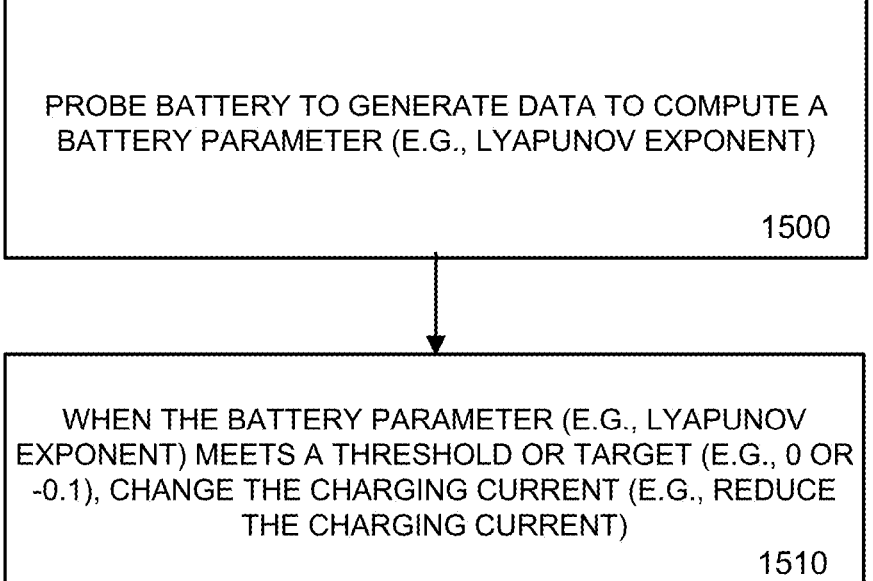
FIG. 15 is a flowchart illustrating one example of a method of battery charging according to aspects of the present disclosure.

Given the information presented above, an example of a system for controlling charge of a battery is shown in FIG. 5. The controller is configured to control charging based on real-time cell degradation feedback. In general, the controller implements a method (see FIG. 15) of real-time monitoring of cell degradation through LE calculation, using a probing waveform, to adjust charging current dynamically, optimizing battery performance and extending lifespan. The method and variations of the same can be implemented in other controllers, with FIG. 5 presenting one possible example.

FIG. 5 shows block diagram of the feedback controller 500. The probing waveform 502 is applied to the cell 504, the current and voltage probing waveform are used to calculate an LE value 506 (or values), which will be sent to a proportional-integral-derivative (PID) controller 508 as inputs (operation 1500). The cell degradation threshold 510 is set as a target value (e.g., −0.1) for the PID controller. The target value may be set as a 0 or negative value (less than 0). It should be recognized that should normalization, averaging or other computations occur that convert the value to a magnitude (without positive or negative connotations), the takeaway is that negative LE values in the sense of the LE computations are intended. Based on the difference between the calculated LE value and the target value, the PID controller output an adjustment to the charging current and applied the optimal charging current to the cell (operation 1510). So, for example, charging current may be dynamically adjusted as LE reader or becomes 0. In one example, charging current may be reduced.

Validation Tests

Figure 6:
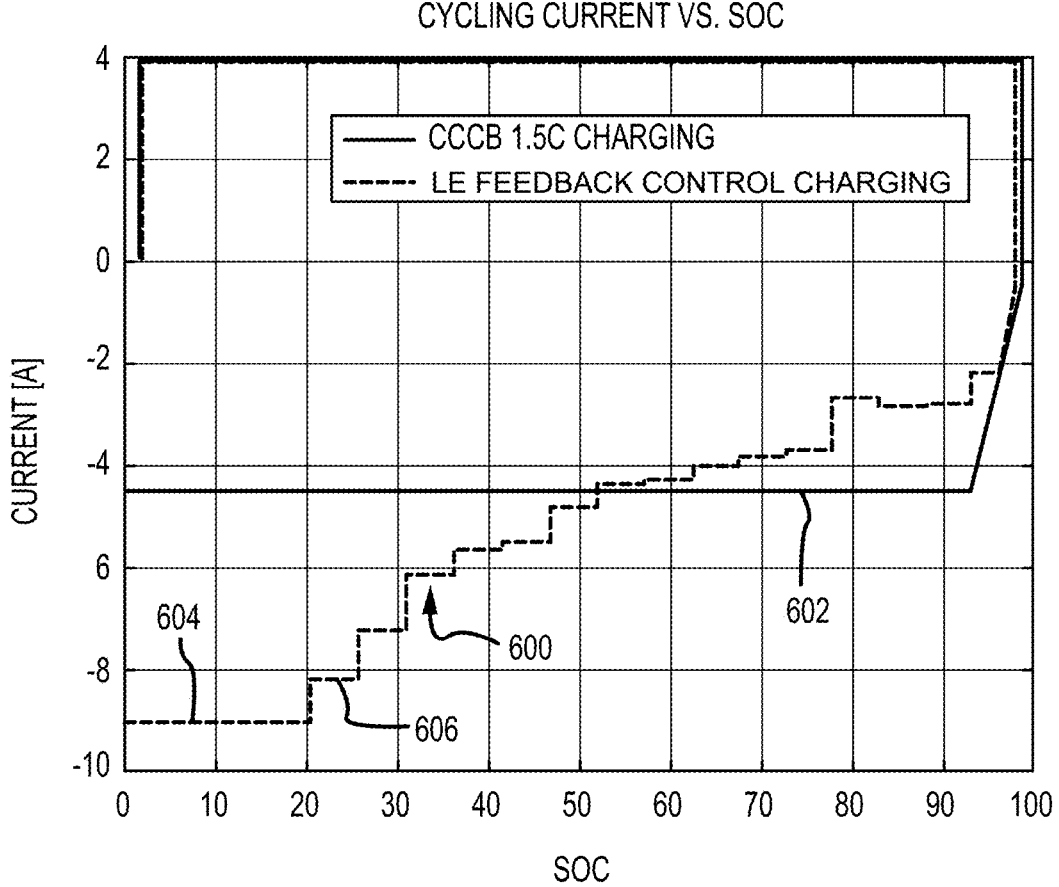
FIG. 6 is a diagram illustrating a multi-step charging protocol generated from a feedback controller using LE compared to a conventional constant current constant voltage (CCCV) charge protocol.

FIG. 6 illustrates charging using LE feedback-based control compared to conventional CCCV charging at 1.5C rate. The feedback controller was applied to a 30T cell to generate an optimal charging protocol. In FIG. 6, a multi-step charging protocol generated in real time from the feedback controller is shown as the curve 600. The charging current magnitude was adjusted every 5% SOC based on real-time cell degradation status. The curve 602 shows a conventional CCCV charging protocol with 1.5C charging rate. In the example of FIG. 6, it can be seen that the initial charging rate of 9 amps 604 was maintained through 20% SOC, at which time the charge current was stepped down 606 in response to an LE computation meeting a threshold indicative of a 0 or negative anode overpotential and the onset of plating. The charge current was then stepped down over subsequent steps based on the same LE computation. In the 1.5 CC charging time through 95% SOC, at some point in the constant current charging, anode overpotential would turn negative leading to plating and the conventional charge protocol does not detect the condition or alter charging leading to lithium plating and battery degradation at even a modest fast charge of 1.5C. The two charging protocols have approximately same charging time but the LE feedback reduces or eliminates plating.

While FIG. 6 illustrates successive charge current reductions, initially charging at a higher rate than CCCV, and then at a lower rate it is also possible that the PID controller may command a charge current increase (or no change). Further, other attributes of the charge signal may be controlled. For example, the controller may increase current for some time to reduce charge time or bump up the charge current for some time to its maximum safe level. In another example, if some form of pulse charging is employed, the average current magnitude of the active period of the pulse may be altered, the duty cycle altered, the time of any rest period between pulses altered, and the other aspects of the pulse controlled. As such, some aspect of the charge signal (or discharge) is controlled responsive to the LE value (or information representative of LE).

Figure 7:
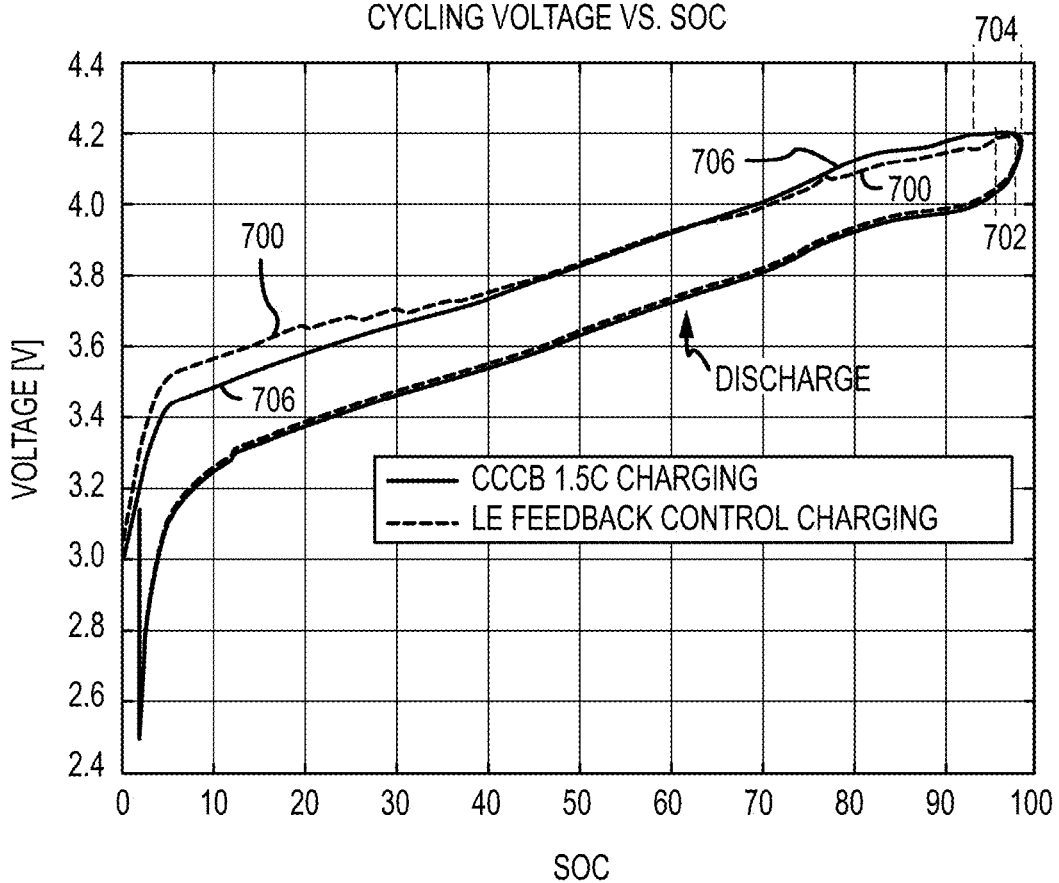
FIG. 7 is a diagram of voltage curves of a multi-step charging protocol triggered based on computations of LE and an anode overpotential threshold versus a charge process with a conventional CCCV protocol.

FIG. 7 shows the charging and discharging voltage curves of the two protocols (0 to 100% SOC charge and then 100% SOC to 0 discharge). It can be seen that that the voltage curve of the multi-step charging protocol 700 has a larger ratio of constant current portion to the constant voltage portion during charging process than the conventional CCCV protocol 706, which indicates a healthier charging process. Stated differently, using the LE feedback control charging, there is a shorter duration 702 at 4.2V and hence meaningfully less time at a voltage (as compared to the constant voltage portion 704 of the CCCV protocol at 1.5C comparison) where there may be detrimental processes occurring within the cell.

Figure 8:
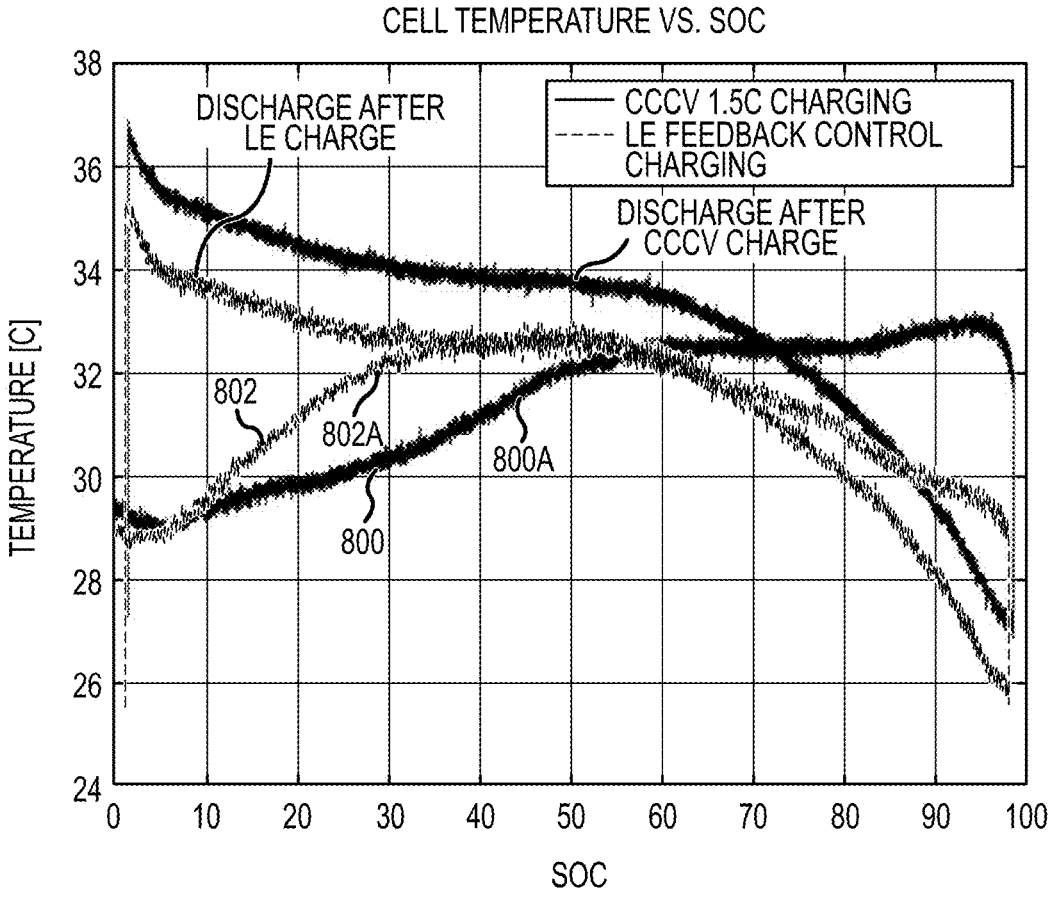
FIG. 8 compares measured battery temperature comparing temperatures from a multi-step charging protocol of the present disclosure versus a conventional CCCV protocol, showing that the multi-step charging protocol may generate less heat while achieving the same or better overall charge times.

FIG. 8 shows the measured temperature during similar full charging and discharging processes of the LE multi-step process 800 as compared to a conventional CCCV process 802. During the charging process, the multi-step charging 802A has a maximum temperature at around 40%-50% SOC and a decreasing temperature relatively lower temperature at end of the charge. So, as shown, during a discharge, the ending temperature from LE charging is lower, given the lower starting point, as compared to discharge after CCCV, which ends at a higher temperature before discharge period. The temperature actually decreased even in the presence of the charge process, noting that the ambient temperature for the test was lower. For the conventional charging process, the temperature keeps increasing to end of the charge 800A, in the same ambient environment. We can see from the FIG. 8 that the multi-step charging protocol has an overall lower temperature increase for a whole cycle as compared to CCCV and can be used to maintain the cell within a healthy temperature range during the entire charge cycle as compared to CCCV, which may result in the cell warming into suboptimal temperature ranges.

Figure 9:
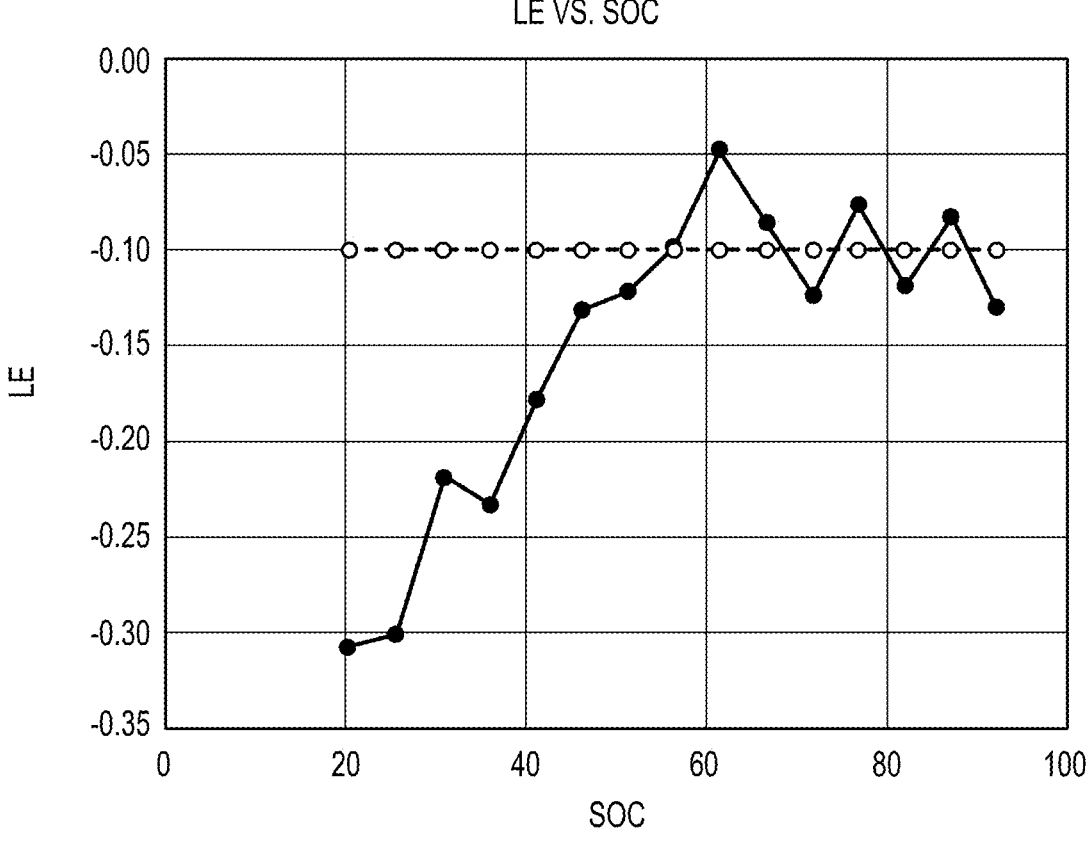
FIG. 9 shows LE values relative to a threshold and the measurements of FIG. 10.

FIG. 9 shows LE calculated at different SOCs using the PID controller discussed above, and where probing waveforms are applied to the cell at the measurement points. The target threshold was set to −0.1. The motivation to set −0.1 instead of 0 as the target threshold is to leave some margin for the controller to avoid cell degradation associated with positive LE values. In the charging scenario depicted in FIG. 6, as the LE value approached 0.1, the PID controller altered the charge current and properly was able to keep the Ly. Exp around the target threshold after SOC>50% (after LE approached −0.1). Due to the correlation with anode over-potential, maintaining the LE value in this way, the anode overpotential was maintained in a healthy state.

Figure 10:
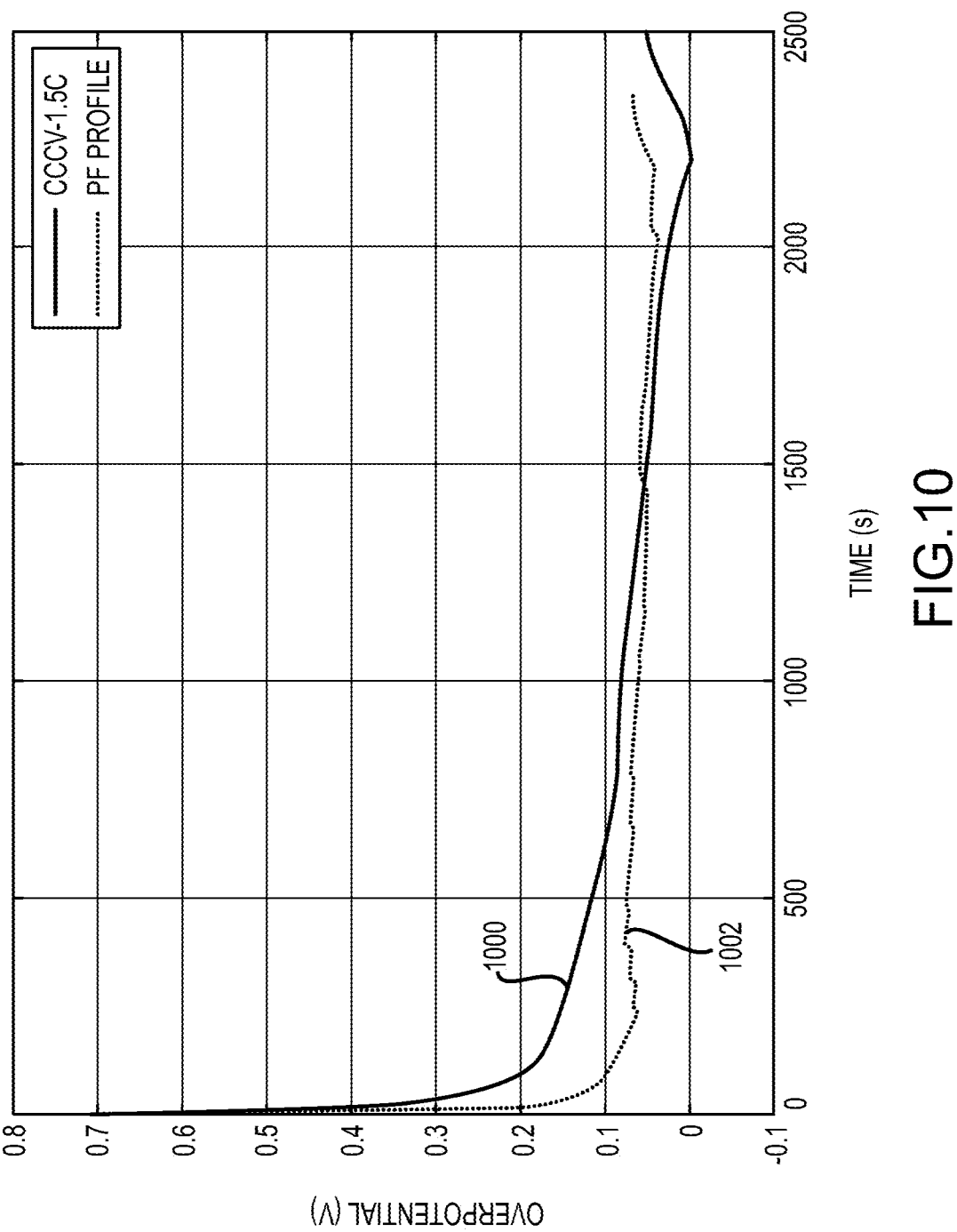
FIG. 10 illustrates simulation results of anode overpotential of multi-step charging protocol as compared to a conventional CCCV protocol.

To further investigate the performance of the multi-step charging protocol generated from the controller as discussed above based on real-time LE calculations, we use a PyBaMM model of the 30T cell to simulate the anode overpotential, SEI growth and capacity losses for the multi-step charging protocol and CCCV protocol. FIG. 10 shows the anode overpotential of the two charging protocols during the charging process. We can see that the anode overpotential of the CCCV protocol 1000 drops to zero near the end of charge, which value is associated with the onset of lithium plating while the anode overpotential of the multi-step charging protocol 1002 is always above zero and has a relatively large margin above zero. This is the case even though the anode overpotential drops rapidly at beginning of charge due to a larger initial charging magnitude, but the anode overpotential stays relatively flat above 0 for the rest of charging process.

Figure 11:
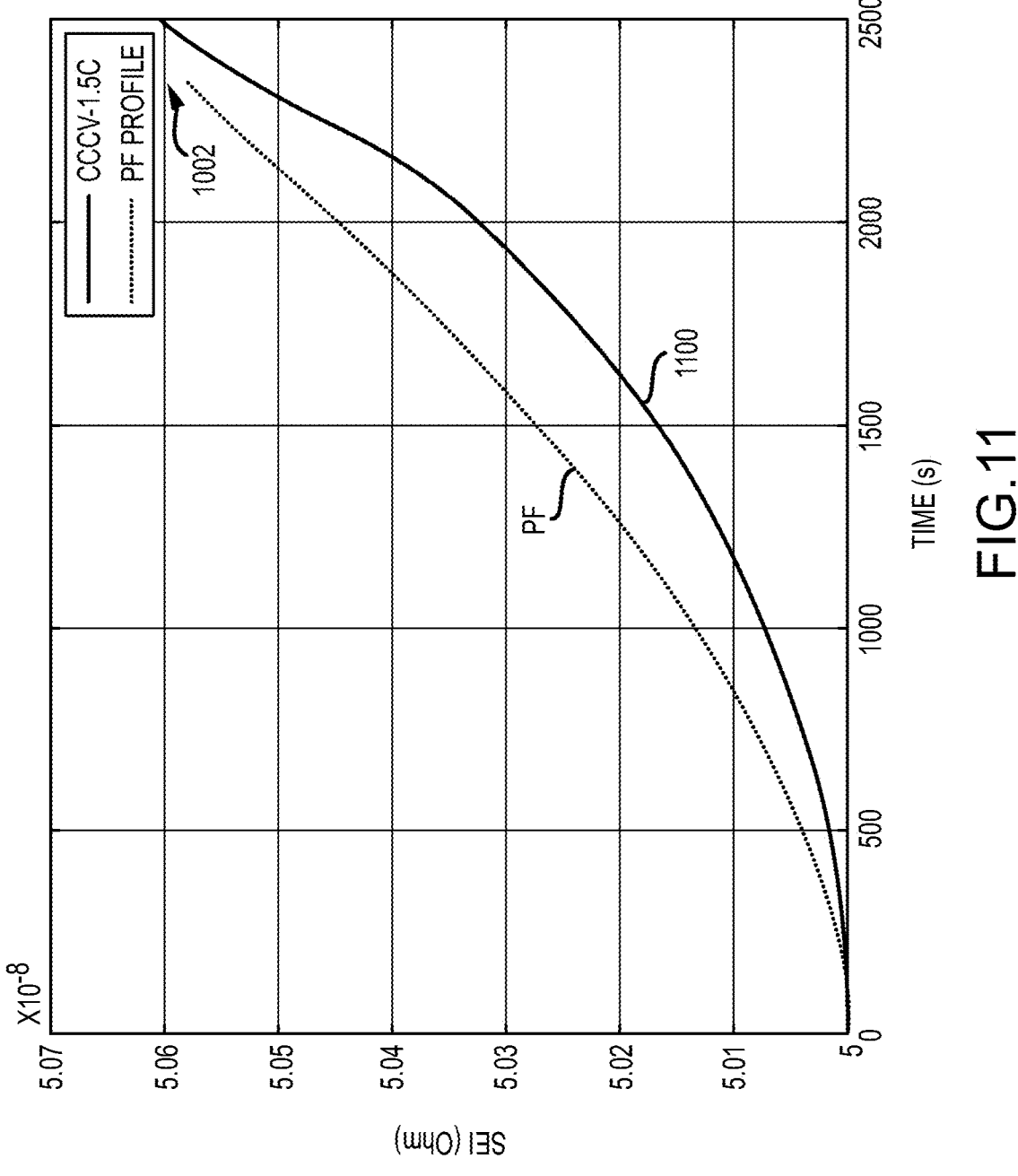
FIG. 11 Simulation results of SEI layer resistance of multi-step charging protocol vs. CCCV protocol.

FIG. 11 shows the SEI layer resistance increase for the multi-step charging protocol (labeled PF) and the conventional CCCV protocol 1100, respectively. It can be seen that the CCCV charging protocol is associated with a slightly larger SEI layer resistance at the end of charging 1102, indicating a larger SEI layer thickness growth. Here, the LE based charging protocol produces less SEI growth and hence less capacity degradation as compared to an equivalent CCCV charge protocol and better charge performance over-all.

Figure 12:
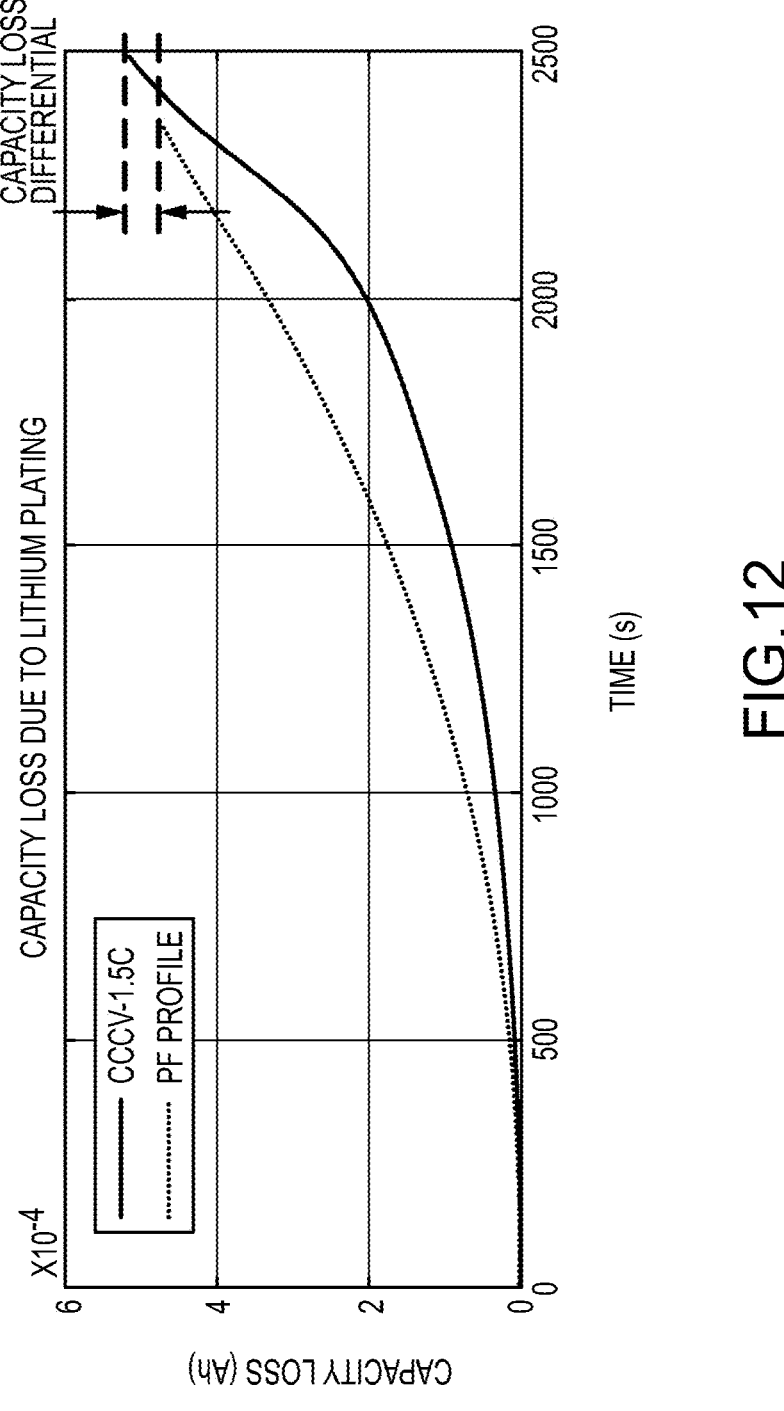
FIG. 12 shows simulation results of capacity loss due to lithium plating of the multi-step charging protocol vs. CCCV protocol.
Figure 13:
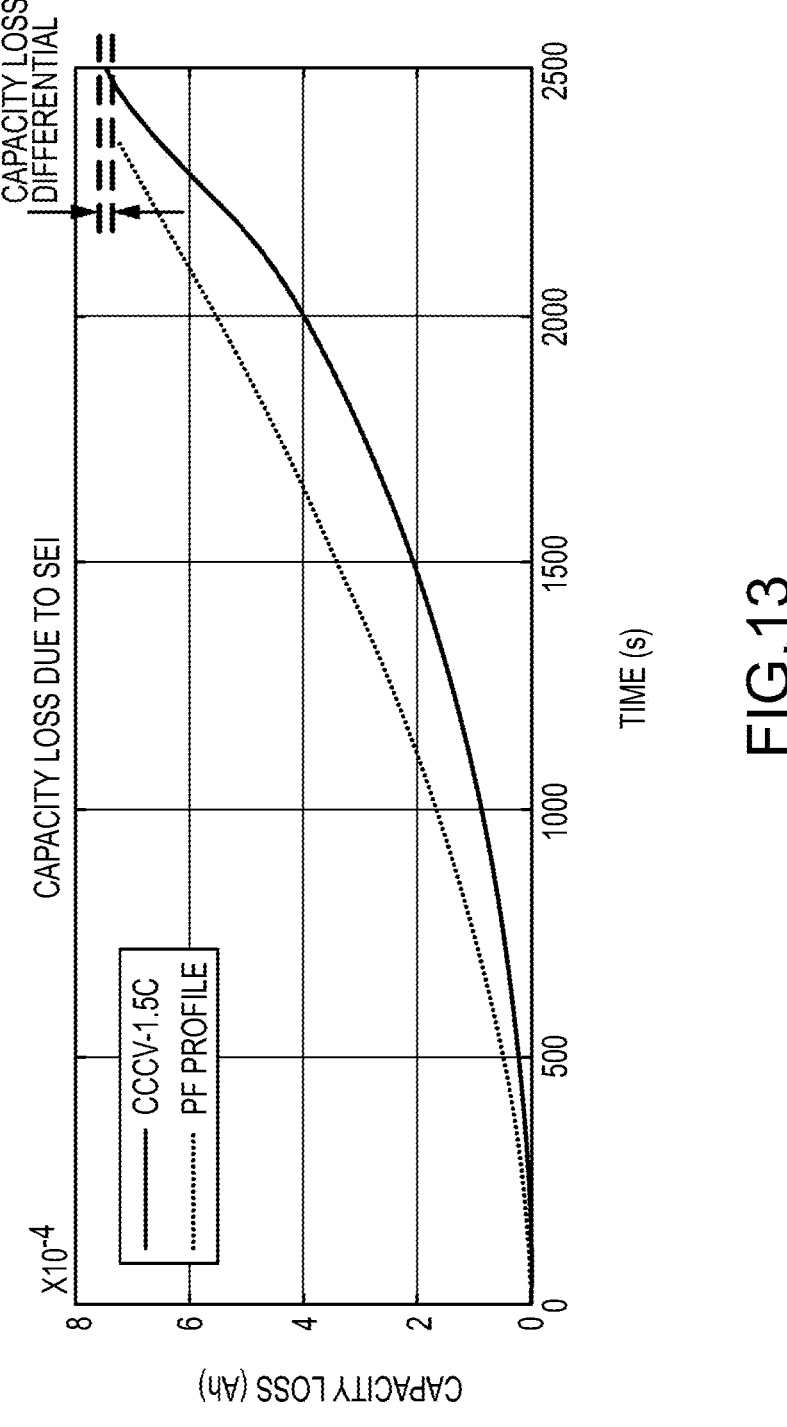
FIG. 13 shows simulation results of capacity loss due to SEI growth of the multi-step charging protocol vs. CCCV protocol.
Figure 14:
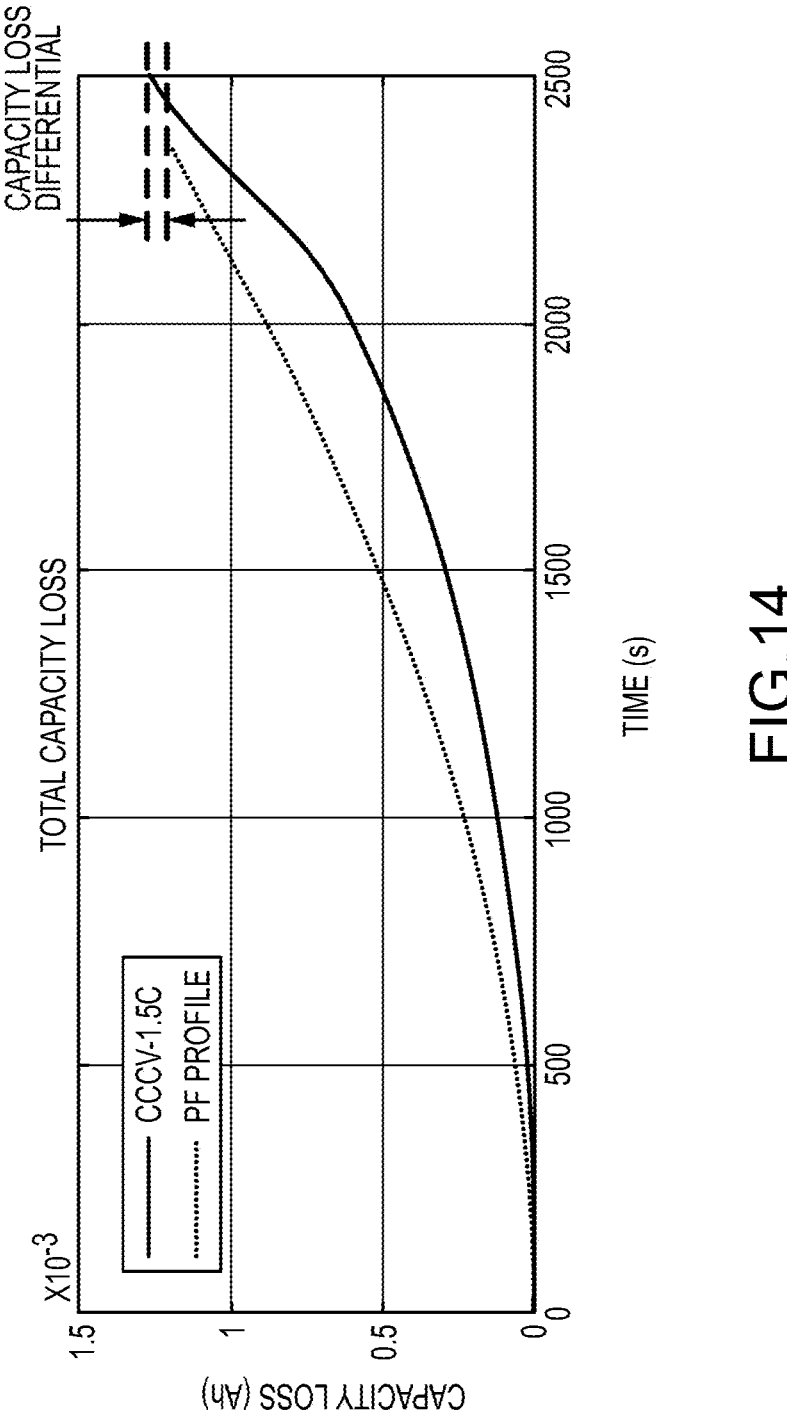
FIG. 14 shows simulation results of total capacity loss of the multi-step charging protocol vs. CCCV protocol.

FIGS. 12 to 14 show the capacity losses (in only one charge cycle) due to lithium plating (FIG. 12), capacity losses due to SEI growth (FIG. 13) and total capacity losses (FIG. 14) respectively for the two charging protocols. For various possible sources of capacity loss, the CCCV proto-col has larger capacity losses than the multi-step charging protocols at end of the charge. Stated differently, a multi-step charging protocol based on LE values can be used to charge a battery with relatively less capacity loss and other detri-mental effects as compared to CCCV protocols. The simu-lation results shown in FIGS. 12 to 14 further show that the multi-step charging protocol has less cell degradation than the conventional CCCV protocol during the charging pro-cess.

What is claimed is:

1. A method of charging a battery comprising:
applying a first charging current to the battery at a first state of charge; and altering the first charging current to a second charging current at a second state of charge,
wherein the second charging current is based on a Lyapunov exponent correlated to anode overpotential meeting a threshold level indicative of electrode plat-ing.

2. The method of claim 1, wherein the threshold level indicative of electrode plating is a Lyapunov exponent value of 0 or a Lyapunov exponent value less than 0.

3. The method of claim 1, wherein the second charging current is further based on a battery temperature.

4. The method of claim 1, wherein the first charging current and the second charging current are dynamically selected based on real-time feedback from the battery.

5. The method of claim 1, wherein a change between the first state of charge and the second state of charge is a fixed state of charge interval.

6. The method of claim 1, wherein the first charging current and the second charging current are charging steps within a multi-step charging protocol.

7. The method of claim 6, further comprising altering the second charging current to a third charging current at a third state of charge, wherein the third charging current is based on the Lyapunov exponent approaching the threshold level indicative of electrode plating.

8. The method of claim 7, wherein the third charging current is less than the second current.

9. A method of charging a battery comprising:
applying a first charging current to the battery; and
altering the first charging current to a second charging current, different from the first charging current,
wherein altering the first charging current to the second charging current is based on a Lyapunov exponent correlated to anode overpotential meeting a threshold level indicative of electrode plating.

10. The method of claim 9, wherein the threshold level indicative of electrode plating is a Lyapunov exponent value of 0 or a Lyapunov exponent value less than 0.

11. The method of claim 9, wherein the second charging current is further based on a battery temperature.

12. The method of claim 9, wherein the first charging current and the second charging current are dynamically selected based on real-time feedback from the battery.

13. The method of claim 9, wherein the first charging current and the second charging current are charging steps within a multi-step charging protocol.

14. The method of claim 13, further comprising altering the second charging current to a third charging current different from the first and second charging current, wherein the third charging current is based on the Lyapunov expo-nent approaching the threshold level indicative of electrode plating.

15. The method of claim 14, wherein the third charging current is less than the second charging current.

* * * * *